US006649460B2

(12) United States Patent
Leobandung

(10) Patent No.: US 6,649,460 B2
(45) Date of Patent: Nov. 18, 2003

(54) FABRICATING A SUBSTANTIALLY SELF-ALIGNED MOSFET

(75) Inventor: Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/028,523

(22) Filed: Oct. 25, 2001

(65) Prior Publication Data

US 2003/0082872 A1 May 1, 2003

(51) Int. Cl.[7] ............... H01L 21/338; H01L 21/336; H01L 21/461
(52) U.S. Cl. ............. 438/183; 438/299; 438/300; 438/692
(58) Field of Search ............... 138/183, 184, 138/299, 300, 692

(56) References Cited

U.S. PATENT DOCUMENTS

| | | | |
|---|---|---|---|
| 4,636,822 A | | 1/1987 | Codella et al. ............. 257/282 |
| 4,835,584 A | * | 5/1989 | Lancaster ............... 257/330 |
| 4,855,246 A | | 8/1989 | Codella et al. ............. 438/185 |
| 5,132,755 A | | 7/1992 | Ueno ............... 257/368 |
| 5,162,884 A | | 11/1992 | Liou et al. ............... 257/384 |
| 5,504,033 A | * | 4/1996 | Bajor et al. ............... 438/405 |
| 5,536,959 A | | 7/1996 | Kellam ............... 257/327 |
| 5,610,083 A | | 3/1997 | Chan et al. ............... 438/155 |
| 5,677,208 A | | 10/1997 | Itou et al. ............... 438/199 |
| 5,710,450 A | | 1/1998 | Chau et al. ............... 257/344 |
| 5,726,081 A | * | 3/1998 | Lin et al. ............... 438/163 |

(List continued on next page.)

OTHER PUBLICATIONS

Stanley Wolf Ph.D. and Richard N. Tauber Ph.D. in Silicon Processing for the VLSI Era, vol. 1: Process Technology, Lattice Press, 1986, pp. 175–177, 531–2.*

Stanley Wolf Ph.D. in Silicon Processing for the VLSI Era, vol. 2: Process Integration, Lattice Press, 1990, pp. 66–67.*

Toshitomi et al., "Sub–50 nm Gate Length N–MOSFETS with 10 nm Phosphorus Source and Drain Junctions", IEDM93, p 6.2.1–6.2.4.

Wolf et al., "Therma Oxidation of Single Crystal Silicon", Silicon Processing for VLSI ESI, vol. 1, p 198–241, Lattice Press 1996.

FIS9–1999–0180, Shallow Source Drain Extension For CMOS FETs, Effendi Leobandung and Ghavan Shahidi, Ser. No. 09/469,921, Filing Date Dec. 22, 1999; FIS9–1999–0315, MOSFETs Having Self–Aligned Poly Silicon Extension and Source/Drain with Barrier, Effendi Leobandung and Herbert L. Ho, Ser. No. 09/561,245, Filing Date Apr. 28, 2000.

IBM Technical Disclsore Bulletin, Process for FET with Short Channel Defined by Shallow Extensions of Drain and Source Diffusions, Jun. 1982, pp 365–366.

Primary Examiner—Olik Chaudhuri
Assistant Examiner—William M. Brewster
(74) Attorney, Agent, or Firm—Joseph P. Abate

(57) ABSTRACT

The present invention includes methods and structures for forming at least a substantially self-aligned MOSFET. According to the present invention, a method of fabricating a semiconductor device includes providing a substrate; providing first materials (such as a first polysilicon) having horizontal surfaces and also having opposed vertical surfaces forming a trench; providing a second material (such as a second polysilicon) in the trench and over the vertical and horizontal surfaces, the second material having a substantially (eg, ±10%) uniform thickness so as to form a notch over the trench; providing a masking material (such as an oxide or a nitride) into the notch, and then removing the second material using the masking material as a mask in a direction toward the first material, so that a vertical surface of one of the first materials is at least substantially aligned with a vertical surface of the second material.

12 Claims, 8 Drawing Sheets

U.S. PATENT DOCUMENTS

| | | | |
|---|---|---|---|
| 5,786,229 A | 7/1998 | Park | 438/429 |
| 5,827,768 A | 10/1998 | Liu et al. | 438/300 |
| 5,891,763 A | 4/1999 | Wanlass | 438/149 |
| 5,903,027 A | 5/1999 | Yoshitomi et al. | 257/327 |
| 5,908,313 A | 6/1999 | Chau et al. | 438/299 |
| 5,915,183 A | 6/1999 | Gambino et al. | 438/300 |
| 5,943,575 A | 8/1999 | Chung | 438/300 |
| 5,953,615 A | 9/1999 | Yu | 438/303 |
| 5,970,353 A | 10/1999 | Sultan | 438/302 |
| 5,985,726 A | 11/1999 | Yu et al. | 438/301 |
| 6,063,658 A | 5/2000 | Horak et al. | 438/248 |
| 6,069,047 A | 5/2000 | Wanlass | 438/305 |
| 6,071,783 A | 6/2000 | Liang et al. | 438/301 |
| 6,090,672 A | 7/2000 | Wanlass | 438/301 |
| 6,110,787 A | 8/2000 | Chan et al. | 438/300 |
| 6,121,100 A | 9/2000 | Andidch et al. | 438/305 |
| 6,165,826 A | 12/2000 | Chau et al. | 438/231 |
| 6,225,173 B1 | 5/2001 | Yu | 438/301 |
| 6,261,923 B1 * | 7/2001 | Kuo et al. | 438/427 |
| 6,337,255 B1 * | 1/2002 | Bradl et al. | 438/424 |
| 2001/0041395 A1 * | 11/2001 | Ajmera et al. | 438/151 |
| 2002/0123212 A1 * | 9/2002 | Kunikiyo | 438/585 |

* cited by examiner

FABRICATING A SUBSTANTIALLY SELF-ALIGNED MOSFET

BACKGROUND OF THE INVENTION

1. Field of the Invention

The present invention relates to integrated circuits and, more particularly, to MOS type semiconductor devices such as MOSFETs.

2. Description of the Related Art

A method of increasing the performance of integrated circuits is to shrink the channel length of an integrated circuit such as a MOSFET. By shrinking the MOSFET channel length, higher on-current and lower gate capacitance can be achieved, so that the overall circuit performance increases. One major challenge in shrinking the transistor channel length is to minimize well-known short channel effects. Short channel effects occur when the source and drain of the MOSFET become too close to each other, which causes the gate of the MOSFET to lose control over the channel causing uncontrollable leakage current even in the off-state of the transistor. To minimize the short channel effects, the depth of the source and drain extensions (junctions) of the MOSFET are reduced, so that the gate can have more control over the channel.

The source and drain extensions are usually formed by implanting electrically active species into a silicon layer to form n+ doped silicon for the NMOSFET source and drain extensions, and p+ doped silicon for the PMOSFET source and drain extensions. In order to reduce the depths of the source and drain extensions, the energy and dose of the implant are reduced considerably. However, even with a very low energy implant, the extension depths cannot be made very shallow because the ion implantation process will spread the dopant profile. See, for example, U.S. Pat. No. 5,903,027, MOSFET with Solid Phase Diffusion Source, issued May 11, 1999, by Toshitomi, et al., and "Sub-50 NM Gate Length N-MOSFETS with 10 NM. "Phosphorous Source and Drain Junctions," by Ono, et al., *IEDM*93 which are hereby incorporated by reference in their entireties. In addition, substantial alignment (substantial coplanarity) of certain vertical surfaces of the gate with certain proximate vertical surfaces of the source and drain extensions helps reduce not only short channel effect but also stray capacitance problems. Various substantially self-aligned MOSFETs and fabrication methods are known.

However, the present inventors believe that known methods for creating substantially (ie, within 10% tolerance) self-aligned MOS type semiconductor devices have not proven to be entirely satisfactory.

SUMMARY OF THE INVENTION

The present invention includes methods and structures for forming at least a substantially self-aligned MOSFET. According to the present invention, a method of fabricating a semiconductor device includes providing a substrate; providing first materials (such as a first polysilicon) having horizontal surfaces and also having opposed vertical surfaces forming a trench; providing a second material (such as a second polysilicon) in the trench and over the vertical and horizontal surfaces, the second material having a substantially (eg, ±10%) uniform thickness so as to form a notch over the trench; providing a masking material (such as an oxide or a nitride) into the notch, and then removing the second material using the masking material as a mask in a direction toward the first material, so that a vertical surface of one of the first materials is at least substantially aligned with a vertical surface of the second material.

The inventive process results in at least a substantially self-aligned gate and uses, eg, known CMP (chemical mechanical polishing/planarization) method that is easy to implement.

Also, CMP to planarize the polysilicon extensions is also easy to implement.

It is an object of the present invention to provide a novel method for fabricating an at least substantially self-aligned semiconductor device.

It is an additional object of the present invention to provide a novel structure useful for fabricating an at least substantially self-aligned semiconductor device such as a MOSFET.

Further and still other objects of the present invention will become more readily apparent when the following detailed description is taken in conjunction with the following drawing figures.

DETAILED DESCRIPTION OF THE PREFERRED EMBODIMENT

Figure 1:
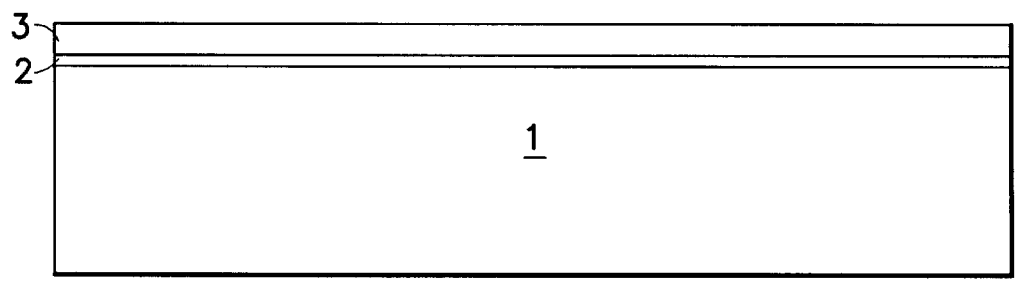
FIGS. 1–14 show top and side block schematic views of various steps according to the present invention.

Below is described a preferred embodiment of the present invention keyed to the drawing FIGS. 1–15.

FIG. 1. A pad oxide (2) is grown and a pad nitride (3) is provided (eg, deposited) on a wafer such as silicon wafer 1. The, eg, 5 nm thick pad oxide 2 is grown using oxidation at around 1000° C., and the pad nitride is deposited using a LPCVD process for a 50 nm thickness.

Figure 2:
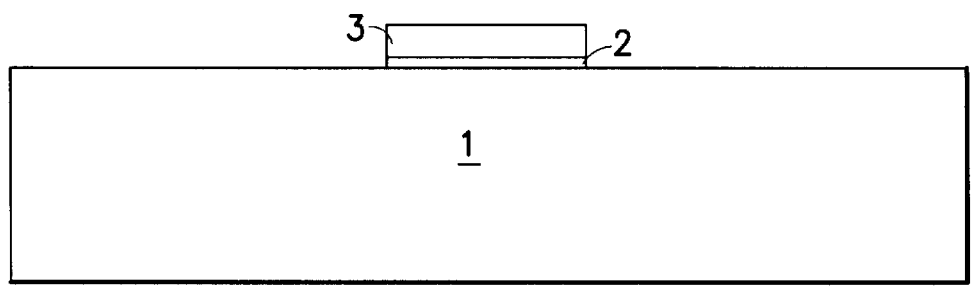

FIG. 2. Photolithography is used to etch the layers 2, 3 away everywhere else except in a designated gate area (see FIG. 8b).

Figure 3:
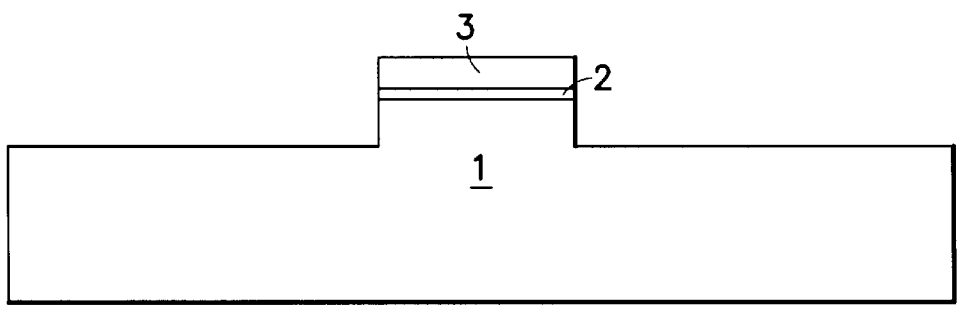

FIG. 3. The silicon wafer 1 is etched away using the nitride 3 as a mask The depth of the silicon etch is around (±10%) 40 nm.

Figure 4:
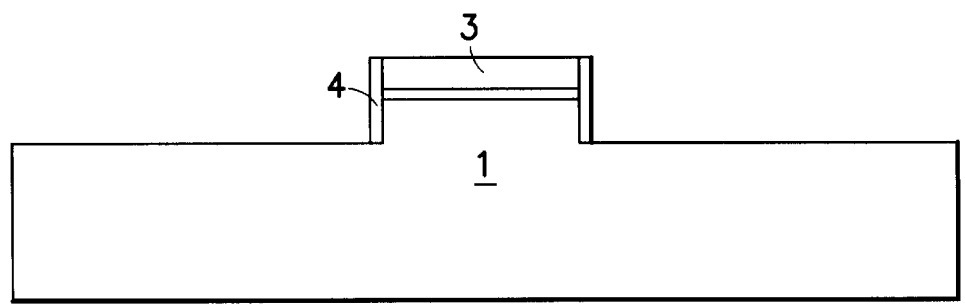

FIG. 4. A silicon nitride sidewall layer (4) is provided by depositing a LPCVD nitride layer and etching it back by using a known reactive ion etching process. This layer 4 is thin enough (eg, 10 nm) so that the layer will not cause any stress on the sidewall. On the other hand, it is thick enough to withstand growing an oxide of around 30 nm.

Figure 5:
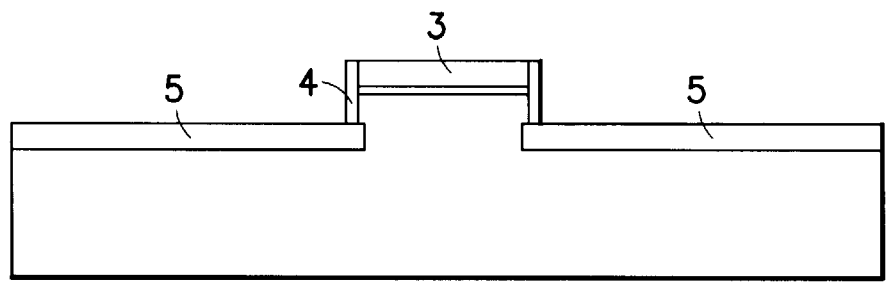

FIG. 5. A known thermal oxidation process is used to grow an oxide layer 5 of around 30 nm thickness. The sidewall 4 is then stripped away using a hot phosphoric acid.

Figure 6:
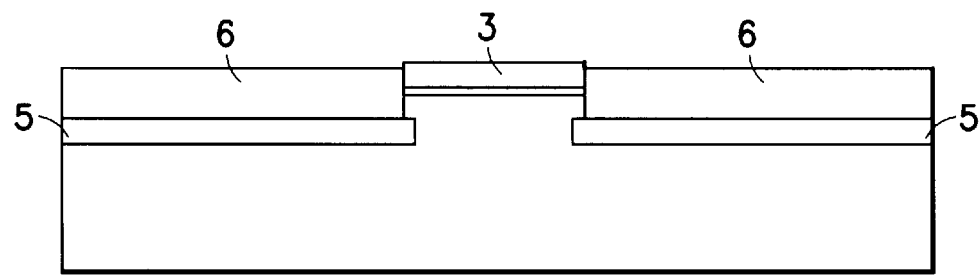

FIG. 6. A layer of polysilicon is deposited and planarized 6 to form source and drain extensions.

Figure 7:
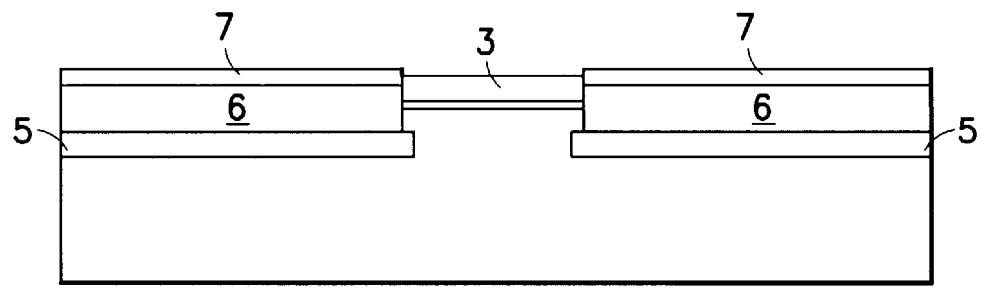

FIG. 7. A layer of oxide 7 is grown to protect the extensions 6. The oxide 7 is around 20 nm thick.

Figure 8A:
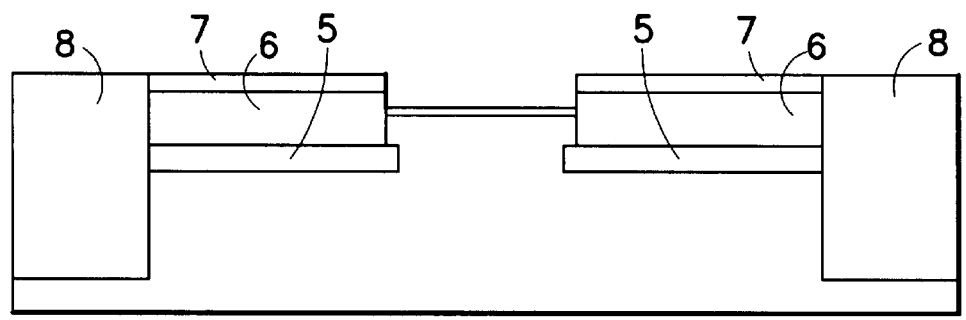
Figure 8B:
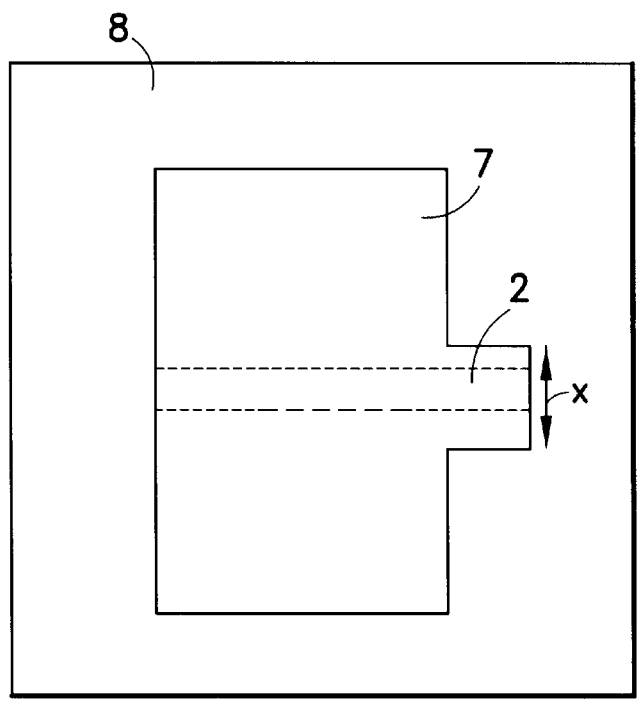

FIG. 8a. A well-known shallow trench isolation (STI) technique is performed by etching a trench and filling it using an oxide 8. See FIG. 8a. Chemical mechanical planarization can be performed stopping at the nitride 3 on the gate. The nitride layer 3 is then etched away using a wet etch such as hot phosphoric acid. FIG. 8b shows a top view of an active area 7, 2 and the STI region 8. A little nob (with a width X) on the active area is drawn around the area where the gate will be formed. The nob X is used for making electrical contact to the gate without shorting the gate to the diffusion 7.

Figure 9:
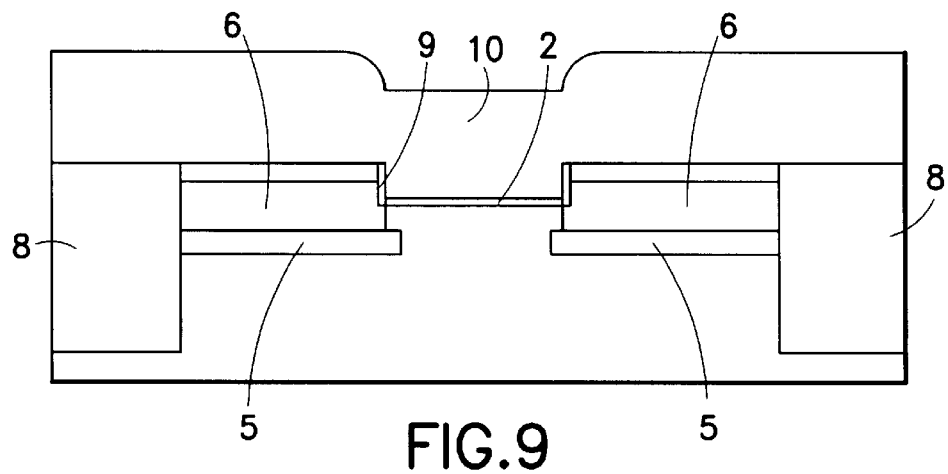

FIG. 9. A gate oxide layer 9 is grown or deposited having a substantially uniform thickness. Then a polysilicon layer 10 having a substantially uniform different thickness T of around 150 nm is grown or deposited. Due to the non-planarity between the gate region and the extension regions, there will be a notch formed in the top of the polysilicon layer 10 overlying the same regions.

Figure 10:
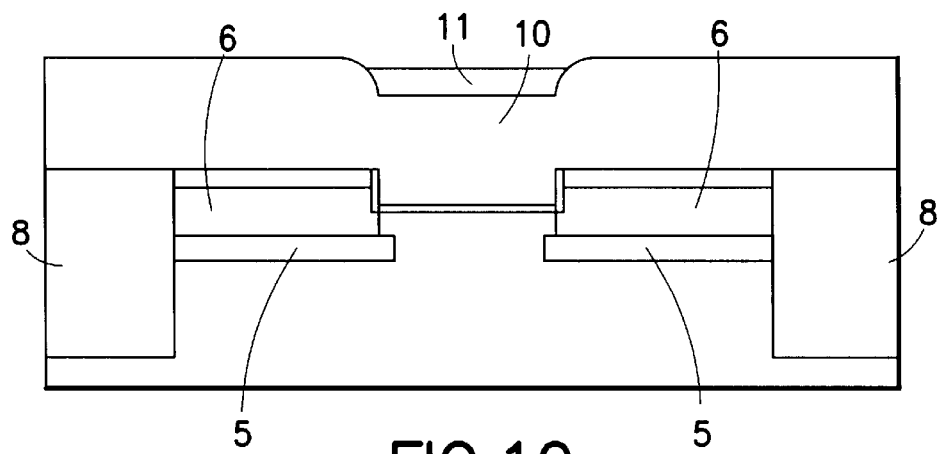

FIG. 10. A layer of oxide or nitride is then deposited onto the polysilicon 10 and planarized. Because of the notch in the polysilicon 10, residual oxide or nitride 11 will remain and can act as a mask.

Figure 11:
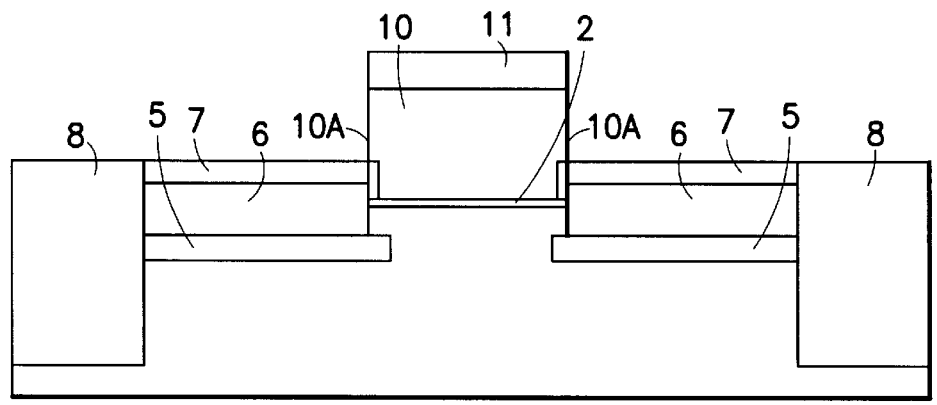

FIG. 11. Using the residual oxide or nitride 11 as the mask, the polysilicon 10 is etched away. At the conclusion of this step, the vertical surfaces 10A of the gate region are substantially (within 10% tolerance) aligned with the vertical surfaces 6A of the extension regions.

Figure 12:
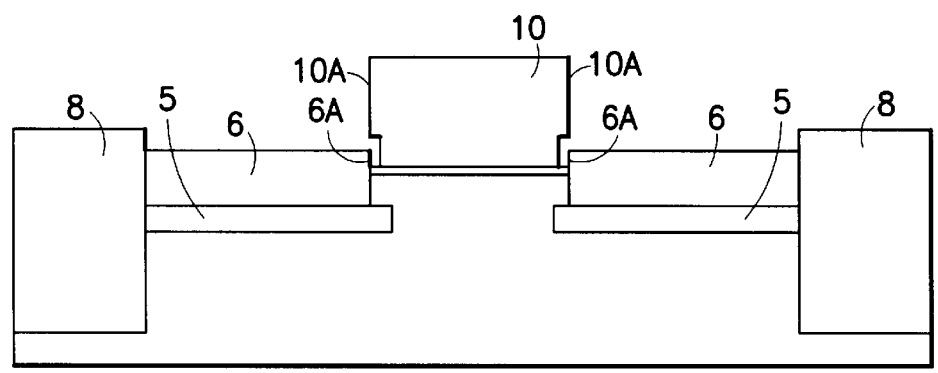

FIG. 12. The protecting oxide layer 7 is etched away using a wet etch and the vertical gate oxide layer 9 is removed using hydrofloric acid, followed by a typical sidewall reoxidation to form a vertical layer 15. See FIG. 14.

Figure 13:
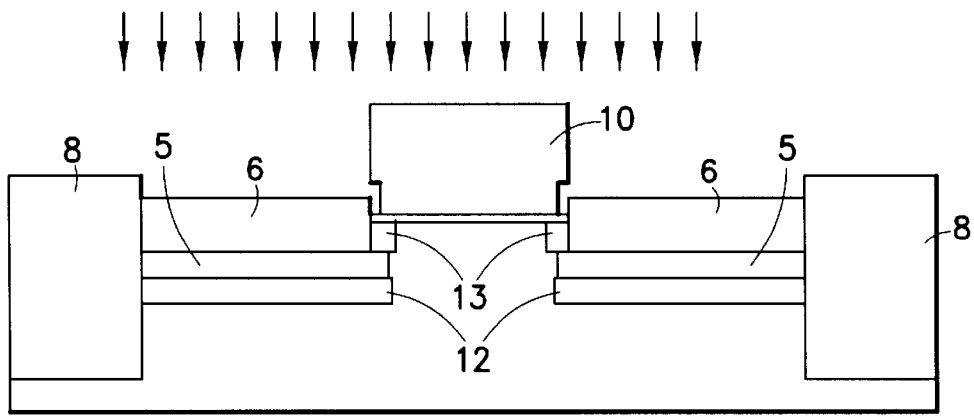

FIG. 13. For a NFET device, a heavy dose of phosphorus around 1E16 is implanted into the extensions 6 and the polysilicon gate 10. This is followed by a zero degree (vertical) implant of Boron below the barrier oxide to form a vertical halo 12. An angled Boron implant can also be used to implant a horizontal halo 13. For a PFET device, opposite dopant type is used.

Figure 14:
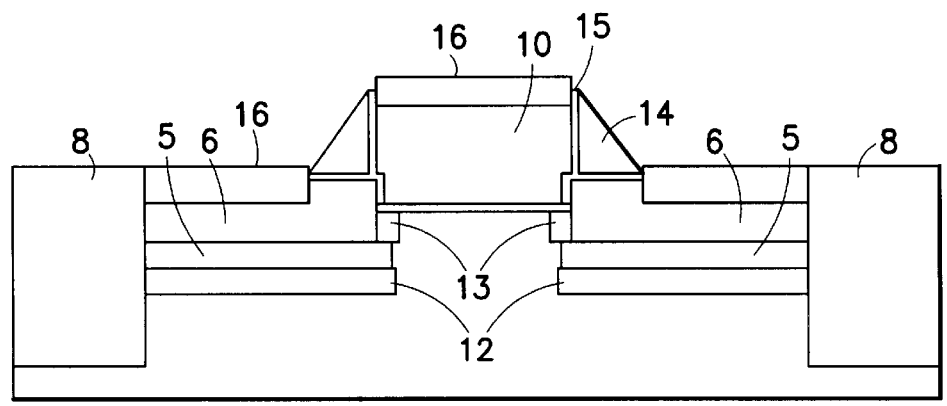

FIG. 14. Side wall spacer 14 can be formed by depositing nitride and etching it back. This is followed by providing a silicide 16 completing the device.

Figure 15:
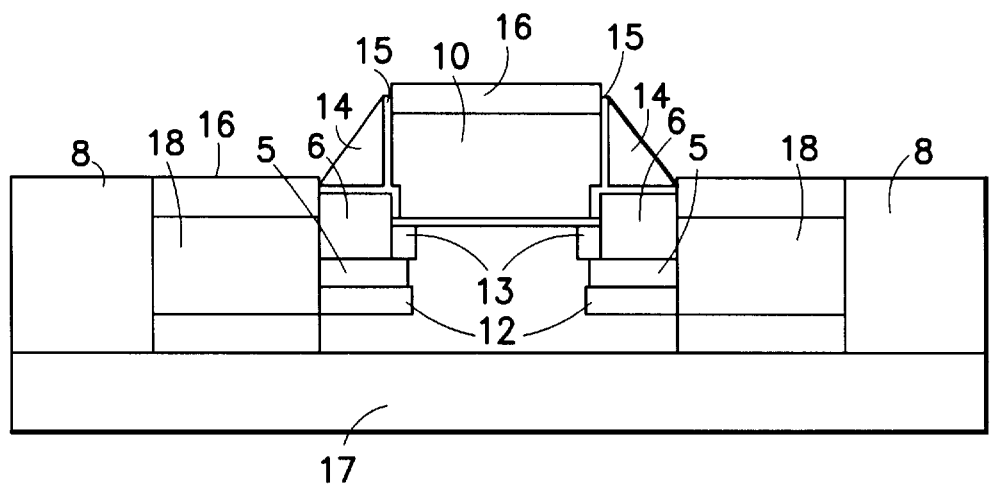
FIG. 15 is a side block schematic view, of a MOSFET mode according to an embodiment of the present invention, which includes an SOI substrate.

FIG. 15. Similar devices can be formed on a SOI substrate by starting with a SOI substrate that has a buried oxide layer 17. In this case, it is advantageous to form deep source and drain 18 by etching the poly/oxide/silicon away and replacing it with polysilicon for the source and drain.

While there has been shown and described what is at present considered a preferred embodiment of the present invention, it will be readily understood by those skilled in the art that various modifications and additions may be made without departing from the spirit and scope of the invention. For example, various features disclosed in the following commonly-owned applications may be used in conjunction with the present invention: FIS9-1999-0180, SHALLOW SOURCE DRAIN EXTENSION FOR CMOS FETS, Effendi Leobandung and Ghavam Shahidi, Ser. No. 09/469,921, Filing Date Dec. 22, 1999; and FIS9-1999-0315, MOSFETS HAVING SELF-ALIGNED POLY SILICON EXTENSION AND SOURCE/DRAIN WITH BARRIER, Effendi Leobandung and Herbert L. Ho, Ser. No. 09/561,245, Filing Date Apr. 28, 2000, which are both hereby incorporated in their entireties by reference.

What is claimed is:

1. A method of fabricating a semiconductor transistor device, comprising:
    providing a substrate;
    providing first materials having horizontal surfaces and also having opposed vertical surfaces forming a trench;
    providing a second material in the trench and over the vertical and horizontal surfaces, the second material having a substantially uniform thickness so as to form a notch over the trench;
    providing a masking material into the notch and planarizing, where the masking material is an insulator, and then
    removing the second material using the masking material as a mask in a direction toward the first material, so that a vertical surface of one of the first materials is at least substantially aligned with a vertical surface of the second material.

2. The method as claimed in claim 1, further comprising providing layers on the on the opposed vertical surfaces of the first materials prior to said step of providing a second material.

3. The method as claimed in claim 1, wherein said step of providing first materials comprises providing polysilicon layers.

4. The method as claimed in claim 1, wherein said step of providing a second material comprises providing a polysilicon layer.

5. The method as claimed in claim 1, wherein said step of providing a masking material comprises providing a layer of oxide into the notch.

6. The method as claimed in claim 1, wherein said step of providing a masking material comprises providing a layer of nitride into the notch.

7. The method as claimed in claim 1, wherein said step of removing the second material comprises wet etching a polysilicon layer having the substantially uniform thickness.

8. The method as claimed in claim 1, wherein each of the first materials comprises a first polysilicon material, and the second material comprises a second polysilicon material, and wherein said method further comprises providing phosphorus materials in the first and second polysilicon materials.

9. The method as claimed in claim 1, wherein said step of providing a substrate comprises providing a silicon substrate.

10. The method as claimed in claim 1, wherein said step of providing a substrate comprises providing a silicon-on-insulator substrate.

11. The method as claimed in claim 1, wherein said step of removing comprises etching the second material on two sides of the masking material in a direction toward the first materials, so that vertical surfaces of the first materials are substantially aligned with vertical surfaces of the second material.

12. A method of fabricating a semiconductor device, comprising:
    providing a semiconductor substrate;
    disposing a first oxide layer on the substrate;
    disposing a nitride layer on the first oxide layer;
    removing portions of the first layers;
    removing portions of the substrate adjacent to the remaining first layers;
    disposing side walls on substantially coplanar surfaces of the first layers and the substrate;
    disposing second oxide layers on surfaces of the substrate which are substantially normal to the side walls;
    removing the side walls;
    disposing and planarizing a first layer of polysilicon on the second oxide layers;
    disposing a third oxide layer on the layer of polysilicon and on the nitride layer;
    removing the third oxide layer from a top of the nitride layer;
    removing the nitride layer to form a trench;
    disposing a second layer of polysilicon having a substantially uniform thickness over the trench and over the third oxide layer, so that the second layer of polysilicon forms a notch;

disposing and planarizing a masking material into the notch so that the masking material substantially fills the notch; and then removing the second layer of polysilicon immediately adjacent to the masking material in a direction normal to the first layer of polysilicon, so that a vertical surface of the second polysilicon layer is substantially coplanar with a vertical surface of the first polysilicon layer.

* * * * *